(12) United States Patent
Huang et al.

(10) Patent No.: US 9,136,140 B2
(45) Date of Patent: Sep. 15, 2015

(54) PATTERNING METHOD

(71) Applicant: United Microelectronics Corp., Hsinchu (TW)

(72) Inventors: Wen-Liang Huang, Hsinchu (TW); Chia-Hung Lin, Tainan (TW); Chun-Chi Yu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 118 days.

(21) Appl. No.: 14/025,524

(22) Filed: Sep. 12, 2013

(65) Prior Publication Data

US 2015/0072532 A1    Mar. 12, 2015

(51) Int. Cl.
*H01L 21/00* (2006.01)
*H01L 21/308* (2006.01)

(52) U.S. Cl.
CPC ........ *H01L 21/3086* (2013.01); *H01L 21/3088* (2013.01)

(58) Field of Classification Search
CPC ........................ H01L 21/3086; H01L 21/3088
See application file for complete search history.

(56) References Cited

U.S. PATENT DOCUMENTS

| 8,114,306 | B2 | 2/2012 | Cheng et al. | |
|---|---|---|---|---|
| 8,273,668 | B2 | 9/2012 | Yoon et al. | |
| 8,336,003 | B2 | 12/2012 | Cheng et al. | |
| 8,398,868 | B2 | 3/2013 | Cheng et al. | |
| 2007/0175859 | A1 | 8/2007 | Black et al. | |
| 2012/0220136 | A1 | 8/2012 | Azuma | |
| 2012/0331428 | A1 | 12/2012 | Cheng et al. | |
| 2014/0248439 | A1* | 9/2014 | Sato et al. | 427/510 |
| 2014/0295669 | A1* | 10/2014 | Kawanishi et al. | 438/702 |

* cited by examiner

*Primary Examiner* — Richard Booth
(74) *Attorney, Agent, or Firm* — J.C. Patents

(57) ABSTRACT

A patterning method is provided. First, a material layer is formed over a substrate. Thereafter, a plurality of directed self-assembly (DSA) patterns are formed on the material layer. Afterwards, a patterned photoresist layer is formed by using a single lithography process. The patterned photoresist layer covers a first portion of the DSA patterns and exposes a second portion of the DSA patterns. Further, the material layer is patterned by an etching process, using the patterned photoresist layer and the second portion of the DSA patterns as a mask.

16 Claims, 4 Drawing Sheets

PATTERNING METHOD

BACKGROUND OF THE INVENTION

1. Field of the Invention

The invention is related to a method of semiconductor fabrication, and more particularly, to a patterning method.

2. Description of Related Art

With the decrease in critical dimension (CD) of the semiconductor device, the demand for the resolution of the lithography process is rising as a result. Since the resolution of the current machine is insufficient, double patterning or multiple patterning is needed to fabricate a smaller CD. However, multiple exposures are needed for the patterning methods, presenting great challenge to pattern placement and overlay. Therefore, how to fabricate a smaller CD has become a relatively important issue in the industry.

SUMMARY OF THE INVENTION

The invention provides a patterning method. The patterning method only needs a single lithography process to form the needed fine pattern.

The invention provides a patterning method. The patterning method can form a fine pattern having a smaller resolution than that of the traditional photolithography method.

The invention provides a patterning method. First, a material layer is formed over a substrate. Thereafter, a plurality of directed self-assembly (DSA) patterns are formed on the material layer. Afterwards, a patterned photoresist layer is formed by using a single lithography process. The patterned photoresist layer covers a first portion of the DSA patterns and exposes a second portion of the DSA patterns. The material layer is patterned by an etching process, using the patterned photoresist layer and the second portion of the DSA patterns as a mask.

In an embodiment of the invention, the DSA patterns have at least one pattern.

In an embodiment of the invention, the at least one pattern includes a hole, a column, a line, a sheet, or a combination thereof.

In an embodiment of the invention, the DSA patterns have a single regular pattern of a fixed dimension.

In an embodiment of the invention, the patterned photoresist layer includes at least one opening exposing the second portion of the DSA patterns.

In an embodiment of the invention, the patterned photoresist layer includes at least one shield area covering the first portion of the DSA patterns.

In an embodiment of the invention, the dimension of the DSA patterns is less than the minimum critical dimension of the patterned photoresist layer.

In an embodiment of the invention, the forming method of the plurality of DSA patterns is as described below. First, a DSA material layer is formed on a material layer, the DSA material layer includes a block polymer, and the block polymer includes at least two block components. Then, annealing is performed on the DSA material layer and one of the block components is removed to form mutually separate and isolated DSA patterns.

The invention further provides a patterning method. A material layer and a hard mask layer are formed on a substrate. Thereafter, a plurality of DSA patterns are formed on the hard mask layer. Next, an etching process is performed to pattern the hard mask layer by using the DSA patterns as a mask to form a patterned hard mask layer. Then, the DSA patterns are removed. Next, a patterned photoresist layer is formed by using a single lithography process to cover a first portion of the patterned hard mask layer and expose a second portion of the patterned hard mask layer. Then, the material layer is patterned by using the patterned hard mask layer and the patterned photoresist layer as a mask.

In an embodiment of the invention, the DSA patterns have at least one pattern.

In an embodiment of the invention, the at least one pattern includes a hole, a column, a line, a sheet, or a combination thereof.

In an embodiment of the invention, the DSA patterns have a single regular pattern of a fixed dimension.

In an embodiment of the invention, the patterned photoresist layer includes at least one opening exposing the second portion of the patterned hard mask layer.

In an embodiment of the invention, the patterned photoresist layer includes at least one shield area covering the first portion of the patterned hard mask layer.

In an embodiment of the invention, the dimension of the DSA patterns is less than the minimum critical dimension of the patterned photoresist layer.

In an embodiment of the invention, the forming method of the plurality of DSA patterns is as described below. First, a DSA material layer is formed on a material layer, the DSA material layer includes a block polymer, and the block polymer includes at least two block components. Then, annealing is performed on the DSA material layer and one of the block components is removed to form mutually separate and isolated DSA patterns.

In the patterning methods of the invention, only a single lithography process is needed to form the needed fine pattern.

The patterning methods of the invention can form a fine pattern having a resolution less than that of the traditional photolithography method.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1F are cross-sectional diagrams of the process of a patterning method illustrated according to the first embodiment of the concept of the invention.

Figure 1A:
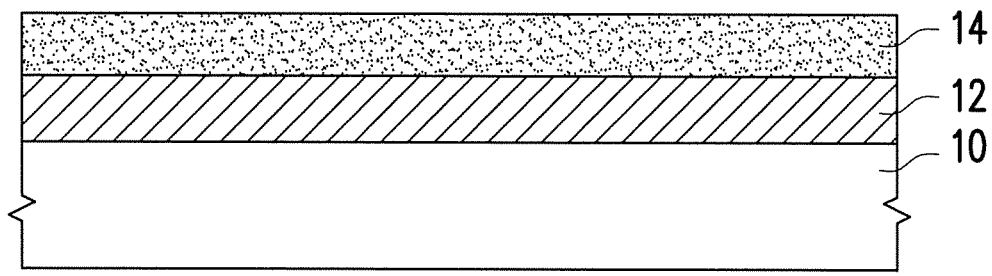
FIG. 1A to FIG. 1F are cross-sectional diagrams of the process of a patterning method illustrated according to the first embodiment of the concept of the invention.

Referring to FIG. 1A, a substrate 10 is provided. The substrate 10 in the invention can include a semiconductor material, an insulating material, a conductive material, or any combination of the materials, and includes a multi-layer structure. For instance, the substrate 10 can be formed by at least one semiconductor material selected from the group consisting of Si, Ge, SiGe, GaP, GaAs, SiC, SiGeC, InAs, and InP. Moreover, a silicon on insulator (SOI) substrate can also be used. The substrate 10 can be formed by a multi-layer material, such as Si/SiGe or Si/SiC. The substrate 10 can include one layer or more than one layer of a material, such as a dielectric layer, a barrier layer SiC for blocking copper, such as a metal layer of copper, a hafnium oxide layer, a silicon layer, a silicon oxide layer, an analogue thereof, or a combination of the layers. The substrate 10 can include an insulating material, such as an organic insulator, an inorganic insulator, a combination thereof, and includes a multi-layer structure. The substrate 10 can include a conductive material such as polysilicon, an elemental material, an alloy of an elemental material, metal silicide, metal nitride, a combination thereof, and includes a multi-layer structure. The substrate 10 can also include an ion implanted region such as a source/drain region formed by implanting P-type or N-type ions.

Referring further to FIG. 1A, then, a material layer 12 is formed on the substrate 10. The material layer 12 can be any suitable semiconductor material, insulating material, or conductive material such as silicon oxide, silicon nitride, silicon oxynitride, a metal, metal nitride, a polysilicon material, or a combination thereof, but is not limited thereto. The forming method of the material layer 12 can be spin coating, chemical vapor deposition (CVD), or physical vapor deposition (PVD), but is not limited thereto.

Then, a DSA material layer 14 can be formed directly on the material layer 12. The DSA material layer 14 includes a block polymer, and the block polymer includes at least two block components that are not immiscible with one another. In the invention, block polymers that can be used to form the DSA material layer 14 can include, but not limited to, for instance, polystyrene-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polyethylethylene, polystyrene-block-polyvinylpyridine, polystyrene-block-polyisoprene, polystyrene-block-polybutadiene, polystyrene-block-polyfenocenyldimethylsilane, polybutadiene-block-polyvinylpyridine, polyisoprene-block-polymethylmethacrylate, polybutadiene-block-polybutylmethacrylate, polybutadiene-block-polydimethylsiloxane, polybutadiene-block-polymethylmethacrylate, polybutylacrylate-block-polymethylmethacrylate, polybutylacrylate-block-polyvinylpyridine, polyisoprene-block-polyvinylpyridine, polyhexylacrylate-block-polyvinylpyridine, polyisobutylene-block-polybutylmethacrylate, polyisobutylene-block-polymethylmethacrylate, polyisobutylene-block-polydimethylsiloxane, polybutylmethacrylate-block-polybutylacrylate, polyethylethylene-block-polymethylmethacrylate, polystyrene-block-polybutylmethacrylate, polystyrene-block-polydimethylsiloxane, polyethylethylene-block-polyvinylpyridine, polyethylene-block-polyvinylpyridine, polyvinylpyridine-block-polymethylmethacrylate, polyethyleneoxide-block-polydimethylsiloxane, or polystyrene-block-polyethyleneoxide. The weight-average molecular weight ($M_w$) of the block polymer of the DSA material layer 14 is, for instance, 3,000 to 400,000 g/mol and the number-average molecular weight ($M_n$) is, for instance, 1,000 to 200,000. The polydispersity ($M_w/M_n$) of the block polymer can be, for instance, 1.01 to 6. The thickness of the DSA material layer 14 needs to reach a critical value $L_O$. If the thickness of the DSA material layer 14 is less than $L_O$, then repeating structural units can not be formed. If the thickness of the DSA material layer 14 is a multiple of $L_O$, then the repeating structural units can be formed. The forming method of the DSA material layer 14 includes, for instance, spin coating, sputtering, or CVD.

Figure 1B:
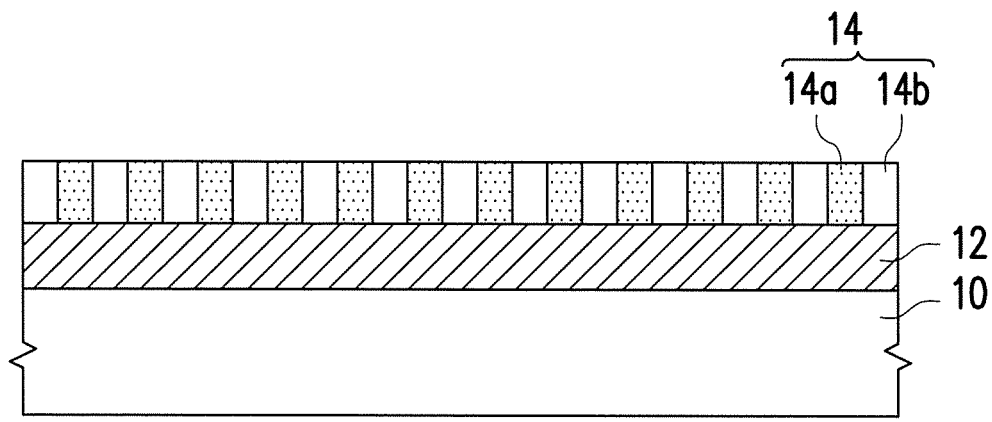

Then, referring to FIG. 1B, a treatment is performed on the DSA material layer 14 such that the two block components in the DSA material layer 14 are phase separated to form a plurality of DSA patterns 14a and DSA patterns 14b. The treatment method can be, for instance, an annealing method. The annealing method can include thermal annealing, thermal gradient annealing, solvent vapor annealing, or other annealing methods. Thermal annealing is also sometimes referred to as a thermal curing process. Thermal curing is used induce the phase separation phenomenon of the DSA material layer 14 and can also be used to reduce or remove defects in a layer in a lateral microphase-separated domain. The thermal curing process includes, for instance, heating the DSA material layer 14 to over the glass transition temperature thereof in a period of time such as several minutes to several days.

Figure 1C:
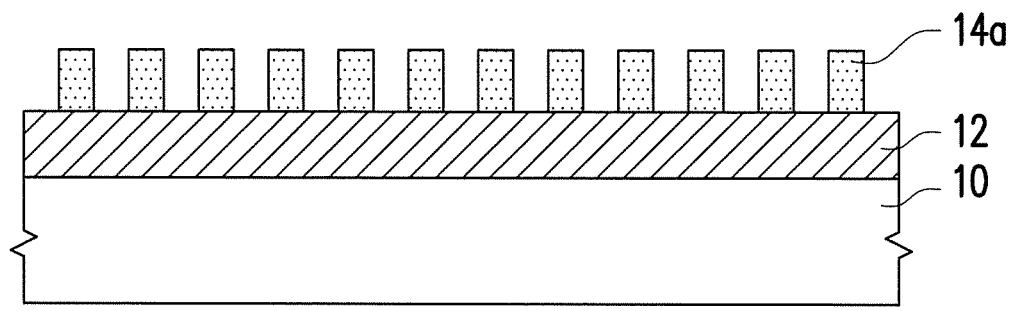

Referring to FIG. 1C, then, the DSA patterns 14b in the DSA material layer 14 are removed, leaving the mutually separate and isolated DSA patterns 14a. The removal method includes, for instance, dissolving the DSA patterns 14b by using a solvent, or, for instance, removing the DSA patterns 14b by using oxygen plasma etching. The selection of the solvent depends on the solubility of the DSA material layer 14, and the solvent can include, for instance, toluene, propylene glycol monomethyl ether acetate (PGMEA), propylene glycol monomethyl ether (PGME), or acetone, but is not limited thereto. In an embodiment, the DSA patterns 14a can include at least one pattern. The pattern of the DSA patterns 14a includes a hole, a column, a line, a sheet, or a combination thereof. In another embodiment, the DSA patterns 14a have a single regular pattern of a fixed dimension. Moreover, the same patterns can have a single pitch therebetween, and the minimum pitch is, for instance, a half pitch of 22 nm or less than 22 nm.

Figure 1D:
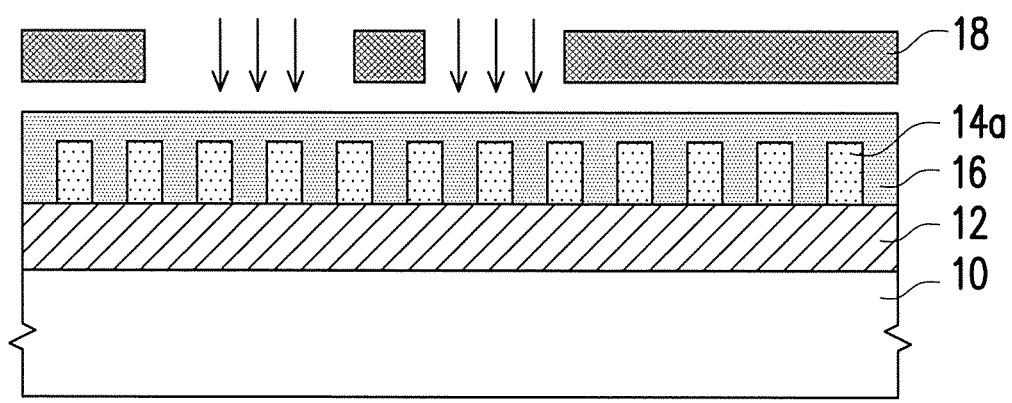
Figure 1E:
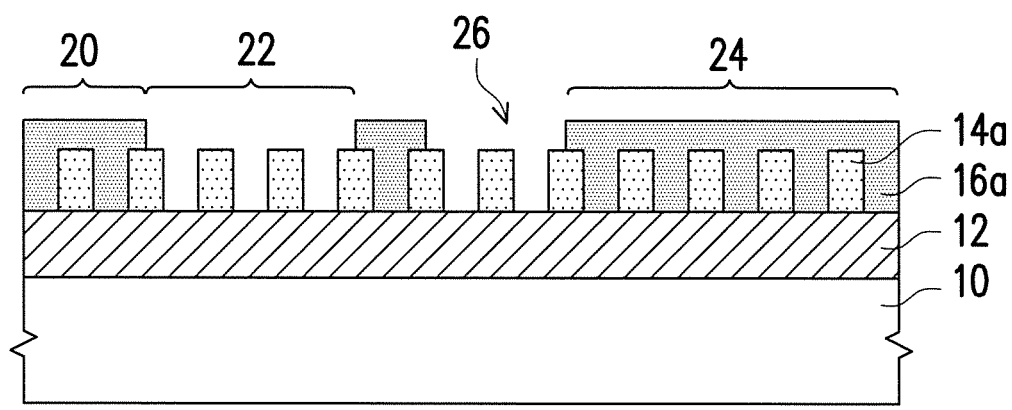

Referring to FIG. 1D and FIG. 1E, a patterned photoresist layer 16a is formed on the material layer 12 by using a single lithography process. The patterned photoresist layer 16a can include at least one shield area 24 covering a first portion 20 of the DSA patterns 14a and the patterned photoresist layer 16a can have at least one opening 26 exposing a second portion 22 of the DSA patterns 14a. The pattern of the at least one shield area 24 can be a line, a block, a column, or a combination thereof. The pattern of the at least one opening 26 can be a circle, an ellipse, a rectangle, or a combination thereof. The steps of the single lithography process are as follows. First, a photoresist layer 16 is formed on the material layer 12 and the DSA patterns 14a. Then, a single exposure is performed on the photoresist layer 16 through a mask 18. Next, a single development is performed to form the patterned photoresist layer 16a. A dimension of the DSA patterns 14a may be less than a minimum critical dimension of the patterned photoresist layer 16a.

Figure 1F:
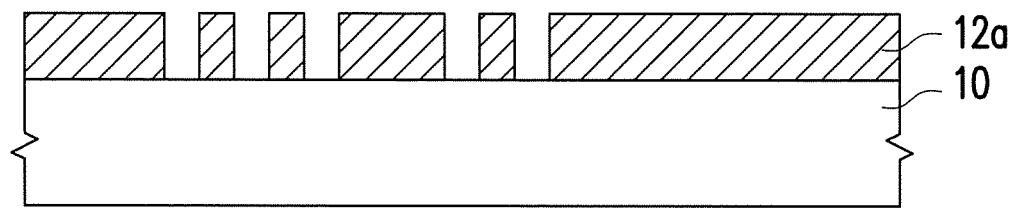

Referring to FIG. 1F, then, an etching process is performed by using the patterned photoresist layer 16a and the second portion 22 of the DSA patterns 14a as a mask to remove the material layer 12 not covered by the second portion 22 of the DSA patterns 14a in the opening 26 of the patterned photoresist layer 16a to pattern the material layer 12 to form a patterned material layer 12a. Next, the patterned photoresist layer 16a and the DSA patterns 14a are removed. The removal method includes, for instance, using a solvent, oxygen plasma or a combination thereof. A portion of the pattern of the patterned material layer 12a is transferred from the DSA patterns 14a, another portion is transferred from the patterned photoresist layer 16a, and even a portion is transferred from a pattern combined from the DSA patterns 14a and the photoresist layer 16a.

FIG. 2A to FIG. 2F are cross-sectional diagrams of the process of a patterning method illustrated according to the second embodiment of the concept of the invention.

Figure 2A:
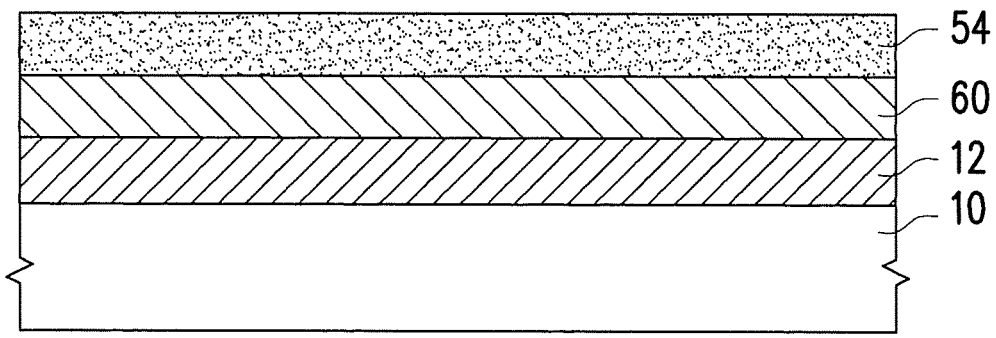
FIG. 2A to FIG. 2F are cross-sectional diagrams of the process of a patterning method illustrated according to the second embodiment of the concept of the invention.

Referring to FIG. 2A, a material layer 12, a hard mask layer 60, and a DSA material layer 54 are formed on a substrate 10 in sequence. The material, thickness, and forming method of each of the substrate 10 and the material layer 12 are as described for each of the substrate 10 and the material layer 12 of the first embodiment above and are not repeated herein. The material, thickness, and forming method of the DSA material layer 54 can be the same as the material, thickness, and forming method of the DSA material 14 and are not repeated herein. The hard mask layer 60 can include any suitable semiconductor material, insulating material, or conductive material such as silicon oxide, silicon nitride, silicon oxynitride, a metal, metal nitride, a polysilicon material, or a combination thereof, but is not limited thereto. The forming method of the hard mask layer 60 can be spin coating, CVD, or PVD, but is not limited thereto. The thickness of the hard mask layer 60 is related to the type and the thickness of the material layer 12 therebelow.

Figure 2B:
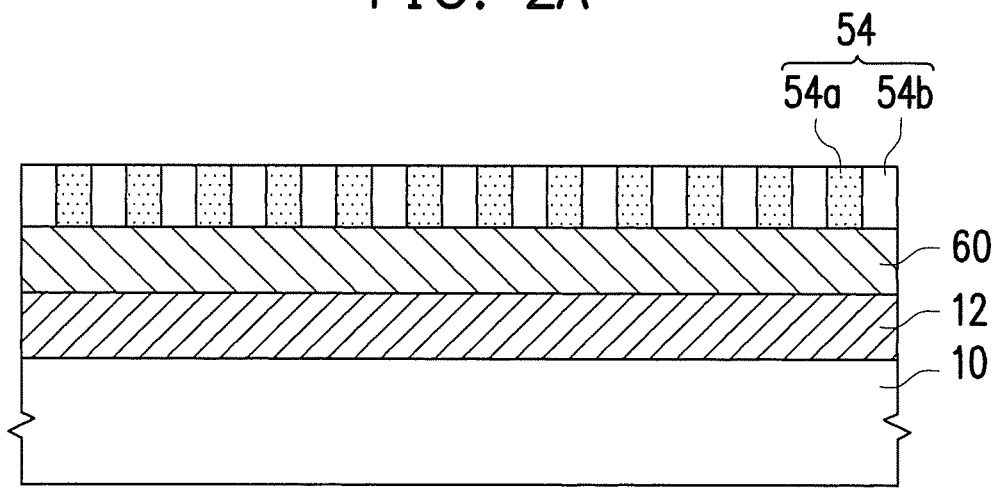

Referring to FIG. 2B, a treatment is performed on the DSA material layer 54 such that the two block components in the DSA material layer 54 are phase separated to form a plurality of DSA patterns 54a and DSA patterns 54b. The treatment method is as described in the first embodiment and is not repeated herein.

Figure 2C:
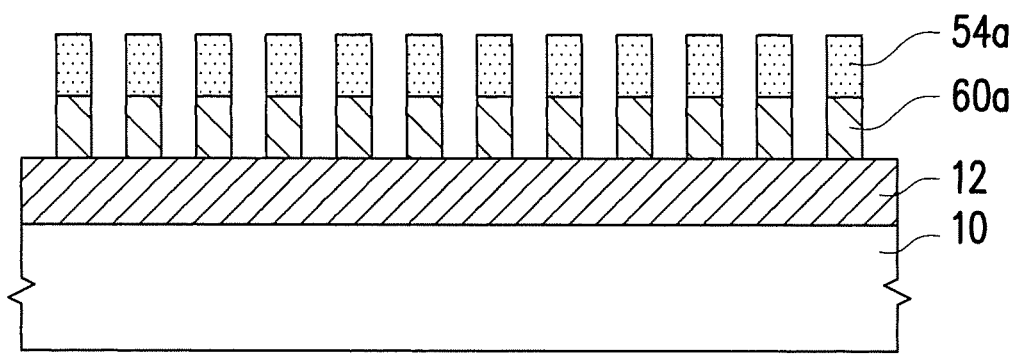

Referring to FIG. 2C, the DSA patterns 54b in the DSA material layer 54 are removed, leaving the DSA patterns 54a. The removal method of the DSA patterns 54b is the same as the removal method of the DSA patterns 14b and is not repeated herein.

Then, the hard mask layer 60 is etched by using the DSA patterns Ma as a mask to form a patterned hard mask layer 60a, and the patterned hard mask layer 60a exposes the material layer 12. The step of etching the hard mask layer 60 can include performing an anisotropic etching process such as a dry etching process.

Figure 2D:
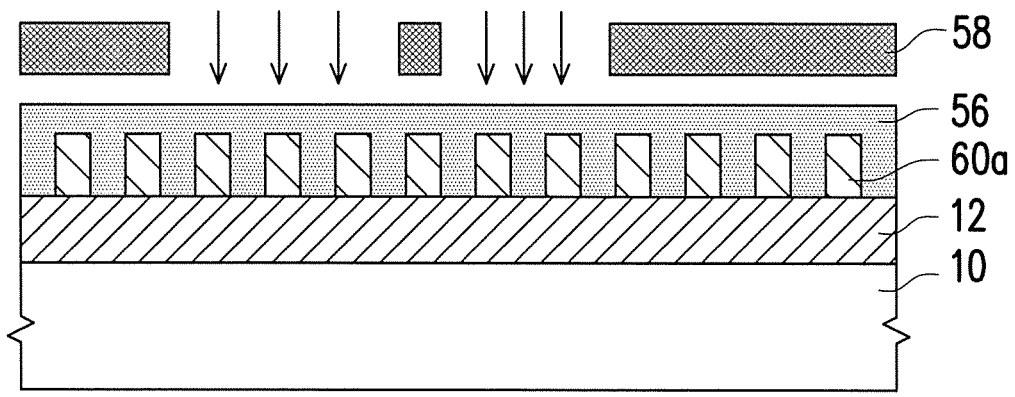
Figure 2E:
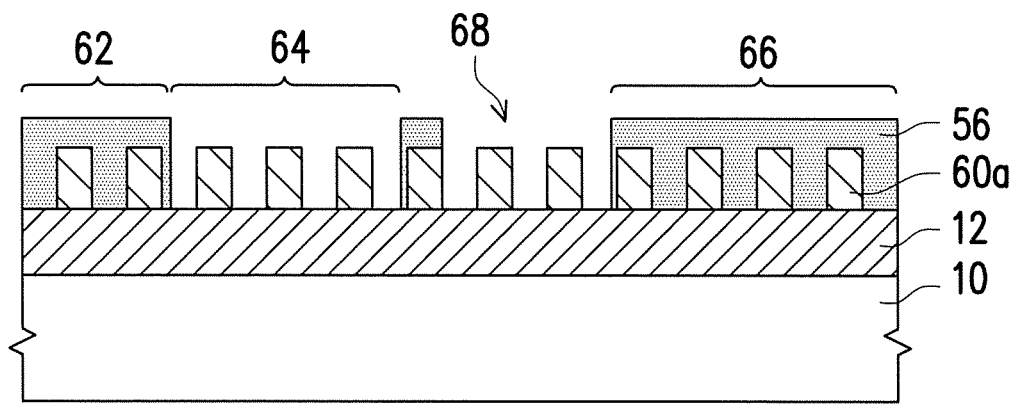

Referring to FIG. 2D and FIG. 2E, the DSA patterns 54a are removed. The removal method of the DSA patterns 54a includes, for instance, dissolving the DSA patterns 54a using a solvent, or, for instance, removing the DSA patterns 54a by using oxygen plasma etching. Then, a single lithography process is performed by using a single mask 58 to form a patterned photoresist layer 56a. The patterned photoresist layer 56a includes at least one shield area 66 covering a first portion 62 of the patterned hard mask layer 60a and the patterned photoresist layer 56a has at least one opening 68 exposing a second portion 64 of the patterned hard mask layer 60a. The pattern of the at least one shield area 66 can be a line, a block, a column, or a combination thereof. The pattern of the at least one opening 68 can be a circle, an ellipse, a rectangle, or a combination thereof. The definition of the single lithography process is as described above and is not repeated herein. A dimension of the DSA patterns 54a may be less than a minimum critical dimension of the patterned photoresist layer 56a.

Figure 2F:
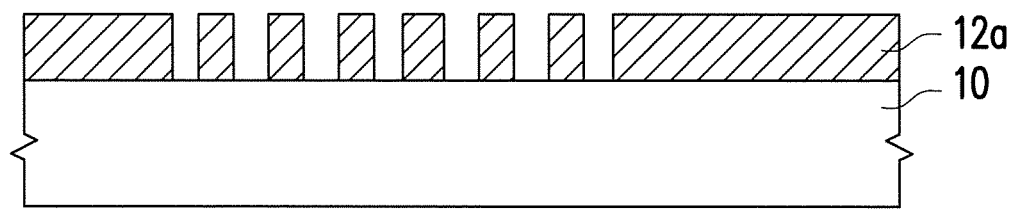

Then, referring to FIG. 2E and FIG. 2F, the material layer 12 is patterned by using the second portion 64 of the patterned hard mask layer 60a and the patterned photoresist layer 56a as a mask to form a patterned material layer 12a. Next, the patterned photoresist layer 56a and the DSA patterns 54a are removed. The removal method includes, for instance, using a solvent, oxygen plasma or a combination thereof. A portion of the pattern of the patterned material layer 12a is transferred from the DSA patterns 54a, another portion is transferred from the patterned photoresist layer 56a, and even a portion is transferred from a pattern combined from the DSA patterns 54a and the photoresist layer 56a.

Based on the above, the patterning methods of the embodiments of the invention use at least one regular pattern provided by a DSA material layer, the at least one regular pattern having a dimension less than the lithographic resolution limit, and combine the at least one regular pattern with a single lithography process to pattern a single material layer, thereby forming a pattern surpassing the lithography limit of the current machine. Since multiple lithography processes do not need to be repeatedly performed for the process of patterning a single material layer of the embodiments of the invention and no hardware in the facility needs to be modified, costs can be significantly reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A patterning method, comprising:
    forming a material layer on a substrate;
    forming a plurality of directed self-assembly (DSA) patterns on the material layer;
    forming a patterned photoresist layer by using a single lithography process to cover a first portion of the DSA patterns and expose a second portion of the DSA patterns; and
    performing an etching process by using the patterned photoresist layer and the second portion of the DSA patterns as a mask to pattern the material layer.

2. The method of claim 1, wherein the DSA patterns comprise at least one pattern.

3. The method of claim 2, wherein the at least one pattern comprises a hole, a column, a line, a sheet, or a combination thereof.

4. The method of claim 1, wherein the DSA patterns have a single regular pattern of a fixed dimension.

5. The method of claim 1, wherein the patterned photoresist layer comprises at least one opening exposing the second portion of the DSA patterns.

6. The method of claim 1, wherein the patterned photoresist layer comprises at least one shield area covering the first portion of the DSA patterns.

7. The method of claim 1, wherein a dimension of the DSA patterns is less than a minimum critical dimension of the patterned photoresist layer.

8. The method of claim 1, wherein a method of forming the plurality of DSA patterns comprises:
    forming a DSA material layer on the material layer, the DSA material layer comprising a block polymer, the block polymer comprising at least two block components; and
    annealing the DSA material layer and removing one of the block components to form the mutually separate and isolated DSA patterns.

9. A patterning method, comprising:
    forming a material layer and a hard mask layer on a substrate;
    forming a plurality of DSA patterns on the hard mask layer and performing an etching process by using the DSA patterns as a mask to pattern the hard mask layer to form a patterned hard mask layer;
    removing the DSA patterns;

forming a patterned photoresist layer by using a single lithography process, wherein the patterned photoresist layer covers a first portion of the patterned hard mask layer and exposes a second portion of the patterned hard mask layer; and patterning the material layer by using the patterned hard mask layer and the patterned photoresist layer as a mask.

10. The method of claim 9, wherein the DSA patterns comprise at least one pattern.

11. The method of claim 10, wherein the at least one pattern comprises a hole, a column, a line, a sheet, or a combination thereof.

12. The method of claim 9, wherein the DSA patterns have a single regular pattern of a fixed dimension.

13. The method of claim 9, wherein the patterned photoresist layer comprises at least one opening exposing the second portion of the patterned hard mask layer.

14. The method of claim 9, wherein the patterned photoresist layer comprises at least one shield area covering the first portion of the patterned hard mask layer.

15. The method of claim 9, wherein a dimension of the DSA patterns is less than a minimum critical dimension of the patterned photoresist layer.

16. The method of claim 9, wherein a method of forming the plurality of DSA patterns comprises:

forming a DSA material layer on the hard mask layer, the DSA material layer comprising a block polymer, the block polymer comprising at least two block components; and annealing the DSA material layer and removing one of the block components to form the mutually separate and isolated DSA patterns.

* * * * *